(12) United States Patent  
Liao et al.

(10) Patent No.: US 11,367,788 B2
(45) Date of Patent: Jun. 21, 2022

(54) SEMICONDUCTOR DEVICE STRUCTURE

(71) Applicant: MEDIATEK INC., Hsinchu (TW)

(72) Inventors: Jing-Chyi Liao, Hsinchu (TW); Ching-Chung Ko, Hsinchu (TW); Zheng Zeng, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/853,889

(22) Filed: Apr. 21, 2020

(65) Prior Publication Data

US 2020/0373428 A1   Nov. 26, 2020

Related U.S. Application Data

(60) Provisional application No. 62/851,686, filed on May 23, 2019.

(51) Int. Cl.
*H01L 29/78* (2006.01)
(52) U.S. Cl.
CPC ...... *H01L 29/7831* (2013.01); *H01L 29/7816* (2013.01)
(58) Field of Classification Search
CPC ............. H01L 29/7831; H01L 29/7816; H01L 29/423; H01L 29/7833; H01L 29/0653; H01L 29/1045; H01L 29/402; H01L 29/0619; H01L 29/7835; H01L 29/7823; H01L 29/42356; H01L 29/66674–66734; H01L 29/04–045; H01L 29/16–1608; H01L 29/0856–0869
See application file for complete search history.

(56) References Cited

U.S. PATENT DOCUMENTS 9,627,528 B2   4/2017   Chien et al.
9,871,132 B1   1/2018   Liu et al.
(Continued)

FOREIGN PATENT DOCUMENTS

EP        1 291 924 A1    3/2003
TW        201036165 A    10/2010
(Continued)

OTHER PUBLICATIONS

European Search Report dated Aug. 24, 2020, issued in application No. EP 20171542.2.

(Continued)

*Primary Examiner* — Shahed Ahmed
(74) *Attorney, Agent, or Firm* — McClure, Qualey & Rodack, LLP

(57) ABSTRACT

A semiconductor device structure is provided. A first well region with a first type of conductivity is formed over a semiconductor substrate. A second well region with a second type of conductivity is formed over the semiconductor substrate. A well region is formed over the semiconductor substrate and between the first and second well regions. A first gate structure is disposed on the well region and partially over the first and second well regions. A drain region is in the first well region. A source region and a bulk region are in the second well region. The drain region, the source region and the bulk region have the first type of conductivity. A second gate structure is disposed on the second well region, and separated from the first gate structure by the source region and the bulk region.

18 Claims, 8 Drawing Sheets

(56) References Cited

U.S. PATENT DOCUMENTS

| | | |
|---|---|---|
| 2011/0156142 A1 | 6/2011 | Teo et al. |
| 2012/0199878 A1 | 8/2012 | Shrivastava et al. |
| 2013/0134511 A1 | 5/2013 | Yang et al. |
| 2014/0103433 A1* | 4/2014 | Lee ............... H01L 29/0653 257/344 |
| 2015/0102427 A1* | 4/2015 | Chen ............... H01L 29/402 257/409 |
| 2015/0255450 A1 | 9/2015 | Shrivastava et al. |
| 2016/0181419 A1* | 6/2016 | Ryu ............... H01L 29/7835 257/343 |
| 2017/0077293 A1 | 3/2017 | Chien et al. |
| 2018/0006148 A1* | 1/2018 | Zhao ............... H01L 21/26586 |
| 2018/0006149 A1 | 1/2018 | Kim et al. |
| 2018/0138312 A1 | 5/2018 | Ng et al. |
| 2018/0350979 A1* | 12/2018 | Reghunathan ...... H01L 29/0865 |
| 2020/0402978 A1* | 12/2020 | Thei ............... H01L 29/42364 |

FOREIGN PATENT DOCUMENTS

| | | |
|---|---|---|
| TW | 201222817 A | 6/2012 |
| TW | 201711199 A | 3/2017 |

OTHER PUBLICATIONS

European Search Report dated Oct. 16, 2020, issued in application No. EP 20171542.2.

Chen, W.Y., et al.; "Circuit and Layout Co-Design for ESD Protection in Bipolar-CMOS-DMOS (BCD) High-Voltage Process;" IEEE Transactions on Circuits and Systems-I Regular Papers; vol. 57; No. 5; May 2010; pp. 1039-1047.

Liu, S.E., et al.; "High Voltage Tolerant Design with Advanced Process for TV Application;" IEEE; Mar. 2019; pp. 1-4.

Chinese language office action dated Feb. 25, 2021, issued in application No. TW 109116386.

* cited by examiner

SEMICONDUCTOR DEVICE STRUCTURE

CROSS REFERENCE TO RELATED APPLICATIONS

This Application claims priority of U.S. Provisional Application No. 62/851,686, filed on May 23, 2019, the entirety of which is incorporated by reference herein.

BACKGROUND OF THE INVENTION

Field of the Invention

The invention relates to a semiconductor device structure, and more particularly to a transistor with a healing gate.

Description of the Related Art

Laterally diffused MOSFETs (LDMOSFETs) are widely used in power management integrated circuits, owing to their high breakdown voltage and their compatibility with standard complementary metal—oxide—semiconductor (CMOS) processes. LDMOSFET transistors particularly suffer from hot-carrier degradation caused by larger electric fields leading to the generation of interface traps in the $Si/SiO_2$ interface within the drift region, which in turn causes the degradation of the electrical parameters (e.g., saturation-region drain current ($I_{dsat}$), linear-region drain current ($I_{dlin}$) and drain-source on-state resistance ($R_{ds-on}$)) limiting the device lifetime.

BRIEF SUMMARY OF THE INVENTION

Semiconductor device structures are provided. An example of a semiconductor device structure is provided. A first well region is formed over a semiconductor substrate and has a first type of conductivity. A second well region is formed over the semiconductor substrate and has a second type of conductivity that is different from the first type of conductivity. A well region is formed over the semiconductor substrate and between the first and second well regions. The well region has a third type of conductivity that is different from the first type of conductivity and the second type of conductivity. A first gate structure of a transistor is disposed on the well region and partially over the first and second well regions. A drain region of the transistor is in the first well region and has the first type of conductivity. A source region of the transistor is in the second well region and has the first type of conductivity. A bulk region of the transistor is in the second well region and has the first type of conductivity. A second gate structure of the transistor is disposed on the second well region. The second gate structure is separated from the first gate structure by the source region and the bulk region.

Furthermore, an embodiment of a semiconductor device structure is provided. A first well region is formed over the semiconductor substrate and has a first type of conductivity. A second well region is formed over the semiconductor substrate and has a second type of conductivity that is different from the first type of conductivity. A first gate structure is disposed partially over the first and second well regions. A drain region of the first type of conductivity is in the first well region. A source region of the first type of conductivity is in the second well region. A bulk region is in the second well region. A second gate structure is disposed on the second well region. The second gate structure is separated from the first gate structure by the source region and the bulk region. The gate length of the first gate structure is greater than that of the second gate structure.

Moreover, an embodiment of a semiconductor device structure is provided. A first well region is formed over the semiconductor substrate and has a first type of conductivity. A second well region is formed over the semiconductor substrate and has a second type of conductivity that is different from the first type of conductivity. A first gate structure is disposed partially over the first and second well regions. A drain region of the first type of conductivity is in the first well region. A source region of the first type of conductivity is in the second well region. A lightly doped region of the first type of conductivity is in the second well region and under the first gate structure. A second gate structure is disposed on the second well region. The second gate structure is separated from the first gate structure by the source region. The lightly doped region is in direct contact with the source region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
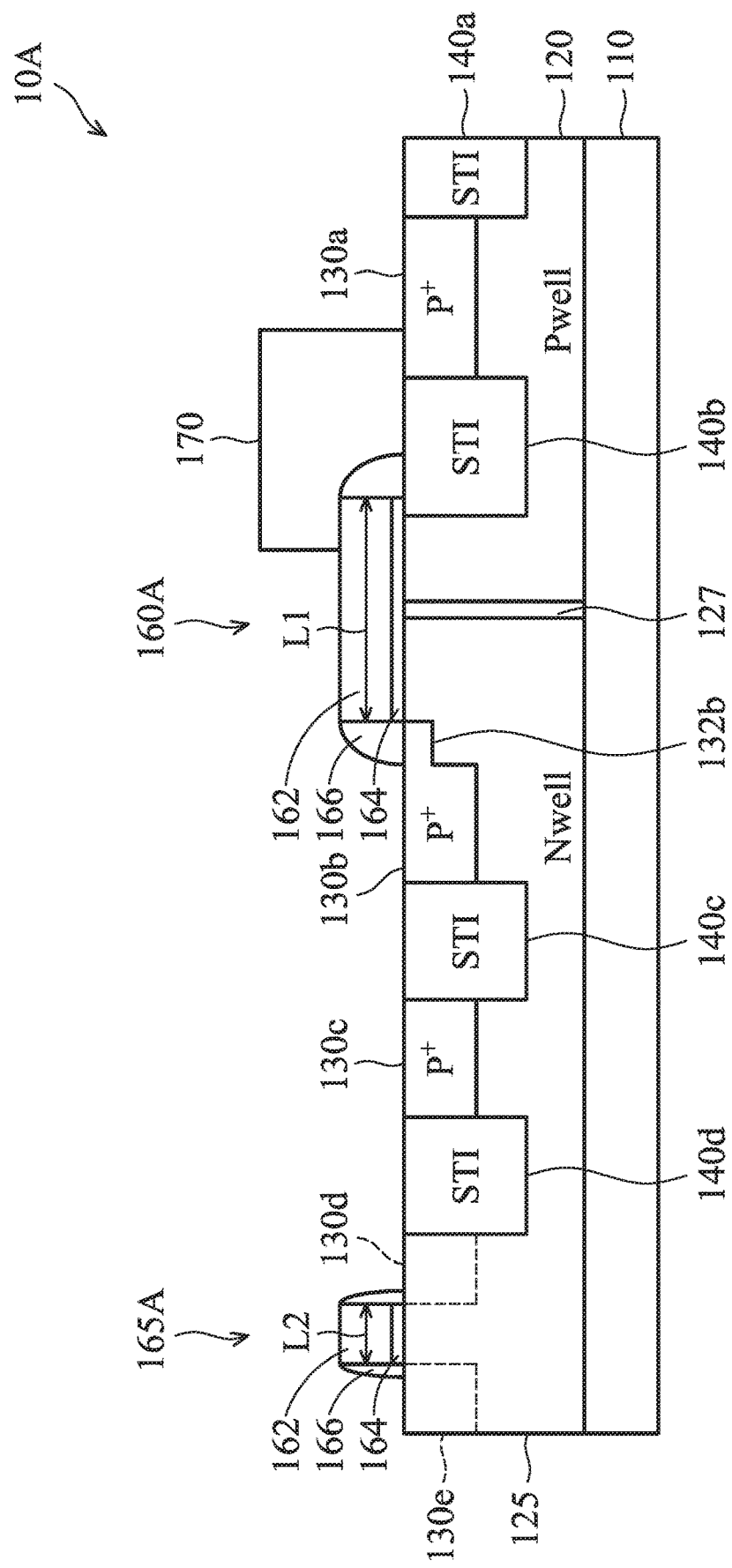
FIG. 1 shows a semiconductor device structure according to an embodiment of the invention.

FIG. 1 shows a semiconductor device structure 10A according to an embodiment of the invention. A P-type well region 120 and an N-type well region 125 are formed over a semiconductor substrate 110. In some embodiments, the semiconductor substrate 110 is a Si substrate. In some embodiments, the material of the semiconductor substrate 110 is selected from a group consisting of bulk-Si, SiP, SiGe, SiC, SiPC, Ge, SOI-Si, SOI-SiGe, III-VI material, and a combination thereof. In some embodiments, a deep N-type well (not shown) is formed over the semiconductor substrate 110, and the P-type well region 120 and the N-type well region 125 are formed over the deep N-type well. A well region 127 is formed over the semiconductor substrate 110 and between the P-type well region 120 and the N-type well region 125. In some embodiments, the well region 127 is no dopant, i.e. the well region 127 is not a P-type well region or an N-type well region. In some embodiments, the semiconductor device structure 10A includes a laterally diffused metal oxide semiconductor (LDMOS) transistor.

The shallow trench isolation (STI) regions 140a and 140b are formed in the P-type well region 120. A P-type doping region 130a is formed in the P-type well region 120 and between the STI regions 140a and 140b. The STI regions 140c and 140d are formed in the N-type well region 125. The P-type doping region 130c is formed in the N-type well region 125 and between the STI regions 140c and 140d. The P-type doping region 130b is formed in the N-type well region 125 and adjacent to the STI region 140c. Furthermore, the P-type doping region 130b further includes a lightly doped region 132b. It should be noted that the size of the P-type doping region 130a is greater than that of the P-type doping regions 130b and 130c.

A gate structure 160A is formed in the semiconductor device structure 10A. The gate structure 160A includes a gate electrode 162, a gate dielectric 164 under the gate electrode 162, and the spacers 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the well region 127 and partially over the P-type well region 120 and the N-type well region 125. The space 166 formed on the left side of the gate electrode 162 is disposed over the lightly doped region 132b, and the space 166 formed on the right side of the gate electrode 162 is disposed over the STI region 140b. A resist protective oxide (RPO) 170 is formed over a portion of the gate structure 160A, the STI region 140b and a portion of the P-type doping region 130a.

The gate dielectric 164 may include a silicon dioxide (referred to as silicon oxide) layer. The gate dielectric 164 may be formed using chemical vapor deposition (CVD), physical vapor deposition (PVD), atomic layer deposition (ALD), thermal oxide, other suitable processes, or combinations thereof. Furthermore, the core oxide is used for healing gate application, so as to gain better gate control ability.

The gate electrode 162 is configured to be coupled to metal interconnects. The gate electrode 162 may include a doped or non-doped polycrystalline silicon (or polysilicon). Alternatively, the gate electrode 162 may include a metal such as Al, Cu, W, Ti, Ta, TiN, TaN, NiSi, CoSi, other suitable conductive materials, or combinations thereof. The gate electrode 162 may be formed by CVD, PVD, ALD, plating, and other proper processes. The gate electrode 162 may have a multilayer structure and may be formed in a multiple-step process.

In the semiconductor device structure 10A, a P-type transistor including the gate structure 160A is formed. In some embodiments, the P-type transistor is a P-type LDMOS transistor. The P-type doping region 130a forms the drain region of the P-type transistor, and the P-type doping region 130b forms the source region of the P-type transistor. The gate structure 160A is separated from the drain region of the P-type transistor by the STI region 140b. The channel region of the P-type transistor is formed between the P-type doping region 130b and the well region 127 and under the gate dielectric 164. Furthermore, the P-type doping region 130c forms the bulk region of the P-type transistor. In some embodiments, the bulk region of the P-type transistor is formed by an N-type doping region.

The P-type transistor further includes a gate structure 165A. The gate structure 165A is an additional healing gate for the PMOS transistor, and the gate structure 165A includes a gate electrode 162, a gate dielectric 164 under the gate electrode 162, and the spacers 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the N-type well region 125. As described above, the gate electrode 162 is configured to be coupled to interconnects. The space 166 formed on the left side of the gate electrode 162 is disposed over the P-type doping region 130e, and the space 166 formed on the right side of the gate electrode 162 is disposed over the P-type doping region 130d. Furthermore, no interconnect is coupled to the P-type doping regions 130d and 130e. It should be noted that no channel region is formed under the gate structure 165A. In some embodiments, only the gate structure 165A is formed in the semiconductor device structure 10A without the P-type doping regions 130d and 130e. It should be noted that the gate length L1 of the gate structure 160A is greater than the gate length L2 of the gate structure 165A.

Figure 2:
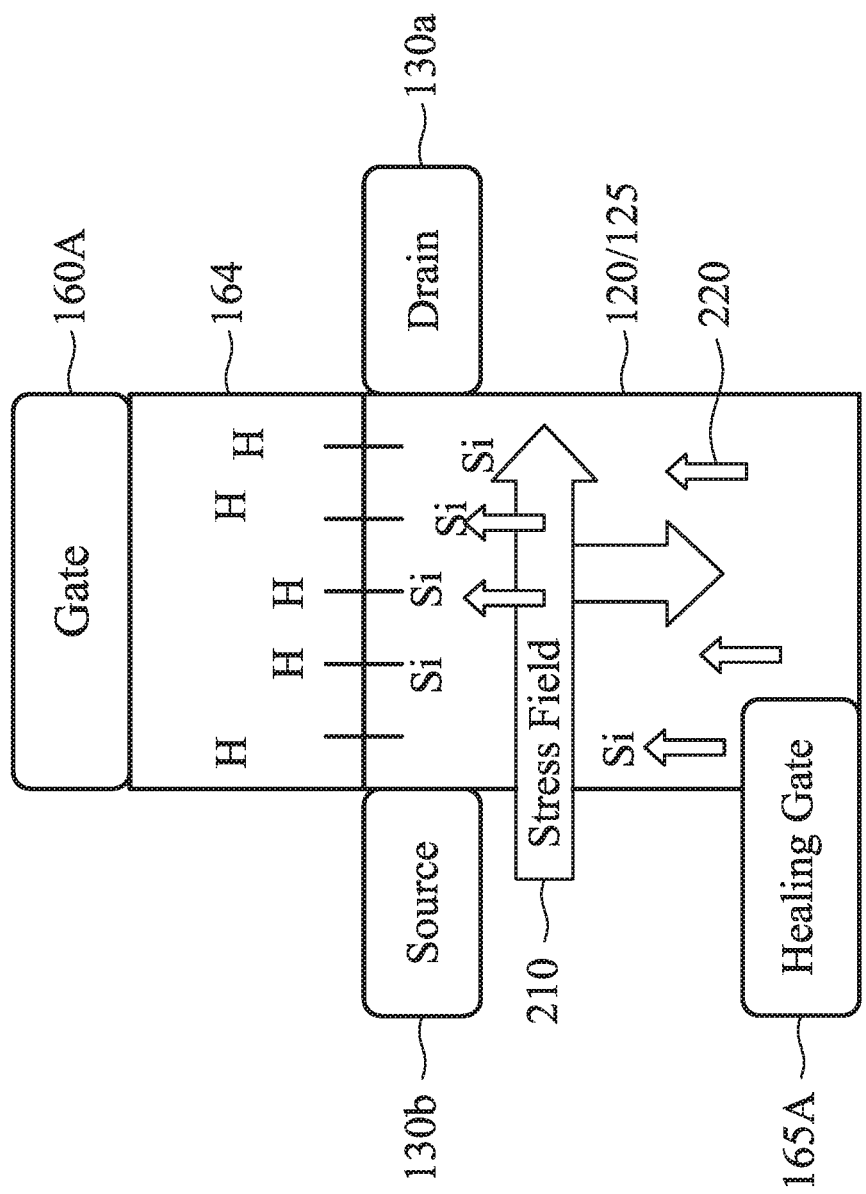
FIG. 2 shows a healing mechanism in the semiconductor device structure of FIG. 1 according to an embodiment of the invention.

FIG. 2 shows a healing mechanism in the semiconductor device structure 10A of FIG. 1 according to an embodiment of the invention. During hot-carrier instability (HCI) stress, vertical and horizontal electrical fields 210 will accelerate hot hole/electron to break Si—H bonds. The dangling bonds become charged to cause mobility degradation, threshold voltage shift, and channel current degradation. By using the healing gate (i.e. the gate structure 165A), the healing field 220 which reverse to the stress field 210 during the HCI stress suppresses impact ionization and also de-traps the HCI-induced trapped charge in the gate dielectric 164. By applying the healing field 220, stability against HCI is improved for higher voltage application without enlarging channel length.

Figure 3:
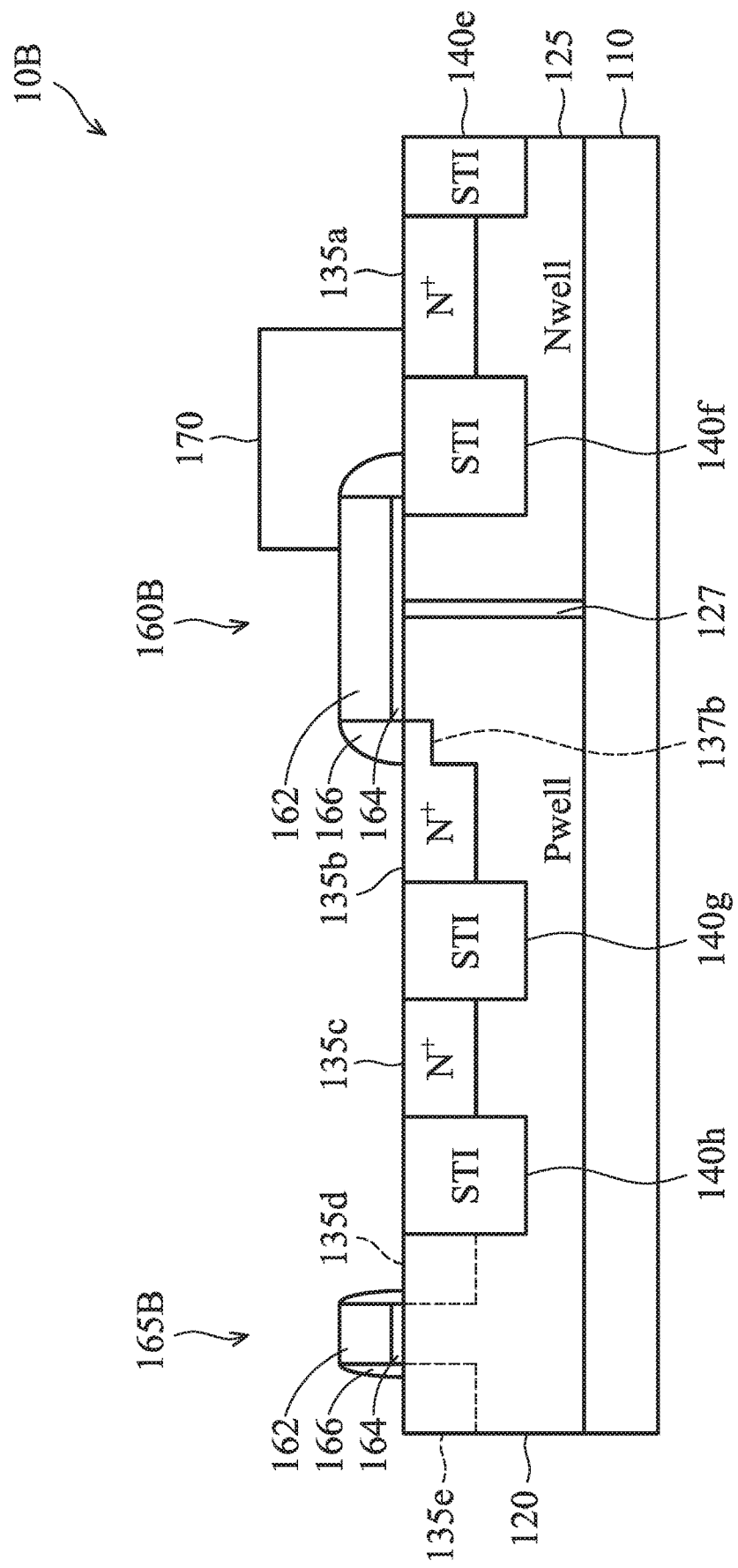
FIG. 3 shows a semiconductor device structure according to an embodiment of the invention.

FIG. 3 shows a semiconductor device structure 10B according to an embodiment of the invention. The P-type well region 120 and the N-type well region 125 are formed over a semiconductor substrate 110. In some embodiments, a deep N-type well (not shown) is formed over the semiconductor substrate 110, and the P-type well region 120 and the N-type well region 125 are formed over the deep N-type well. A well region 127 is formed over the semiconductor substrate 110 and between the P-type well region 120 and the N-type well region 125. In some embodiments, the well region 127 is no dopant, i.e. the well region 127 is not a P-type well region or an N-type well region. In some embodiments, the semiconductor device structure 10B includes a LDMOS transistor.

The STI regions 140e and 140f are formed in the N-type well region 125. An N-type doping region 135a is formed in the N-type well region 125 and between the STI regions 140e and 140f. The STI regions 140g and 140h are formed in the P-type well region 120. The N-type doping region 135c is formed in the P-type well region 120 and between the STI regions 140g and 140h, and the N-type doping region 135b is formed in the P-type well region 120 and adjacent to the STI region 140g. Furthermore, the N-type doping region 135b further includes a lightly doped region 137b. It should be noted that the size of the N-type doping region 135a is greater than that of the N-type doping regions 135b and 135c.

A gate structure 160B is formed in the semiconductor device structure 10B. The gate structure 160B includes a gate electrode 162, a gate dielectric 164 under the gate electrode 162, and the spacers 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the well region 127 and partially over the P-type well region 120 and the N-type well region 125. The space 166 formed on the left side of the gate electrode 162 is disposed over the lightly doped region 137b, and the space 166 formed on the right side of the gate electrode 162 is disposed over the STI region 140f. A resist protective oxide (RPO) 170 is formed over a portion of the gate structure 160B, the STI region 140f and a portion of the N-type doping region 135a.

In the semiconductor device structure 10B, an N-type transistor including the gate structure 160B is formed. In some embodiments, the N-type transistor is an N-type LDMOS transistor. The N-type doping region 135a forms the drain region of the N-type transistor, and the N-type doping region 135b forms the source region of the N-type transistor. The channel region of the N-type transistor is formed between the N-type doping region 135b and the well region 127 and under the gate dielectric 164. Furthermore, the N-type doping region 135c forms the bulk region of the N-type transistor. In some embodiments, the bulk region of the N-type transistor is formed by a P-type doping region.

The N-type transistor further includes a gate structure 165B. The gate structure 165B is an additional healing gate for the N-type transistor, and the gate structure 165B includes a gate electrode 162, a gate dielectric 164 under the gate electrode 162, and the spaces 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the P-type well region 120. As described above, the gate electrode 162 is configured to be coupled to interconnects. The space 166 formed on the left side of the gate electrode 162 is disposed over the N-type doping region 135e, and the space 166 formed on the right side of the gate electrode 162 is disposed over the N-type doping region 135d. Furthermore, no interconnect is coupled to the N-type doping regions 135d and 135e. It should be noted that no channel region is formed under the gate structure 165B. In some embodiments, only the gate structure 165B is formed in the semiconductor device structure 10B without the P-type doping regions 135d and 135e.

Referring to FIG. 1 and FIG. 3 together, the configuration of the semiconductor device structure 10A of FIG. 1 is similar to the configuration of the semiconductor device structure 10B of FIG. 2. The difference between the semiconductor device structure 10A including the P-type transistor and the semiconductor device structure 10B including the N-type transistor is that the well regions and the doping regions in the semiconductor device structures 10A and 10B have different type (e.g., opposite type) of conductivity.

Figure 4:
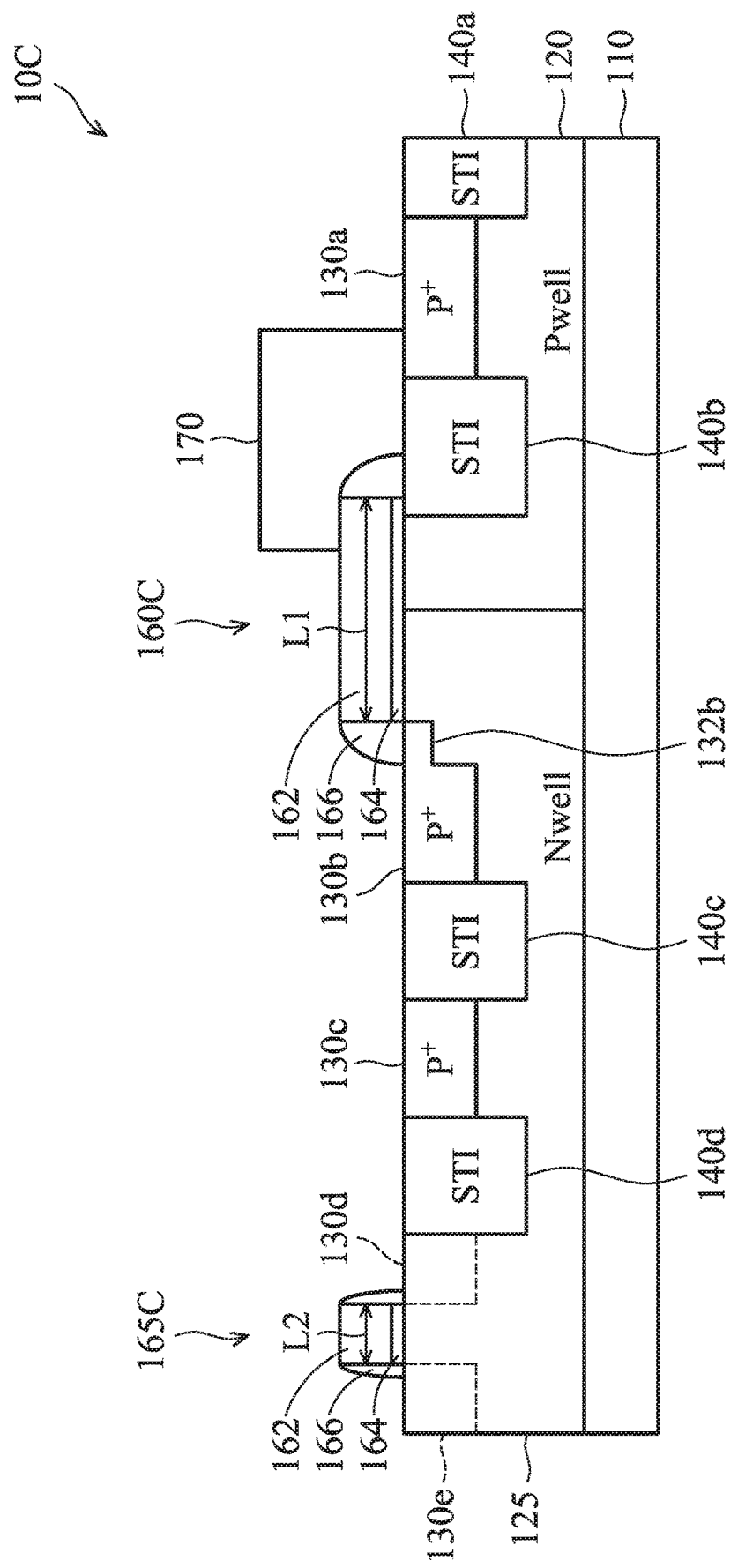
FIG. 4 shows a semiconductor device structure according to an embodiment of the invention.

FIG. 4 shows a semiconductor device structure 10C according to an embodiment of the invention. The semiconductor device structure 10C includes a P-type transistor with the gate structures 160C and 165C. The configuration of the semiconductor device structure 10C of FIG. 4 is similar to the configuration of the semiconductor device structure 10A of FIG. 1. The difference between the semiconductor device structure 10C and the semiconductor device structure 10A is that no well region 127 is formed between the P-type well region 120 and the N-type well region 125 in the semiconductor device structure 10C. In other words, the P-type well region 120 is in direct contact with the N-type well region 125 in the semiconductor device structure 10C. Similarly, by changing the type of conductivity of the well regions and the doping regions in the semiconductor device structure 10C, an N-type transistor is obtained in the semiconductor device structure 10C. In some embodiments, the N-type transistor is an N-type LDMOS transistor.

Figure 5:
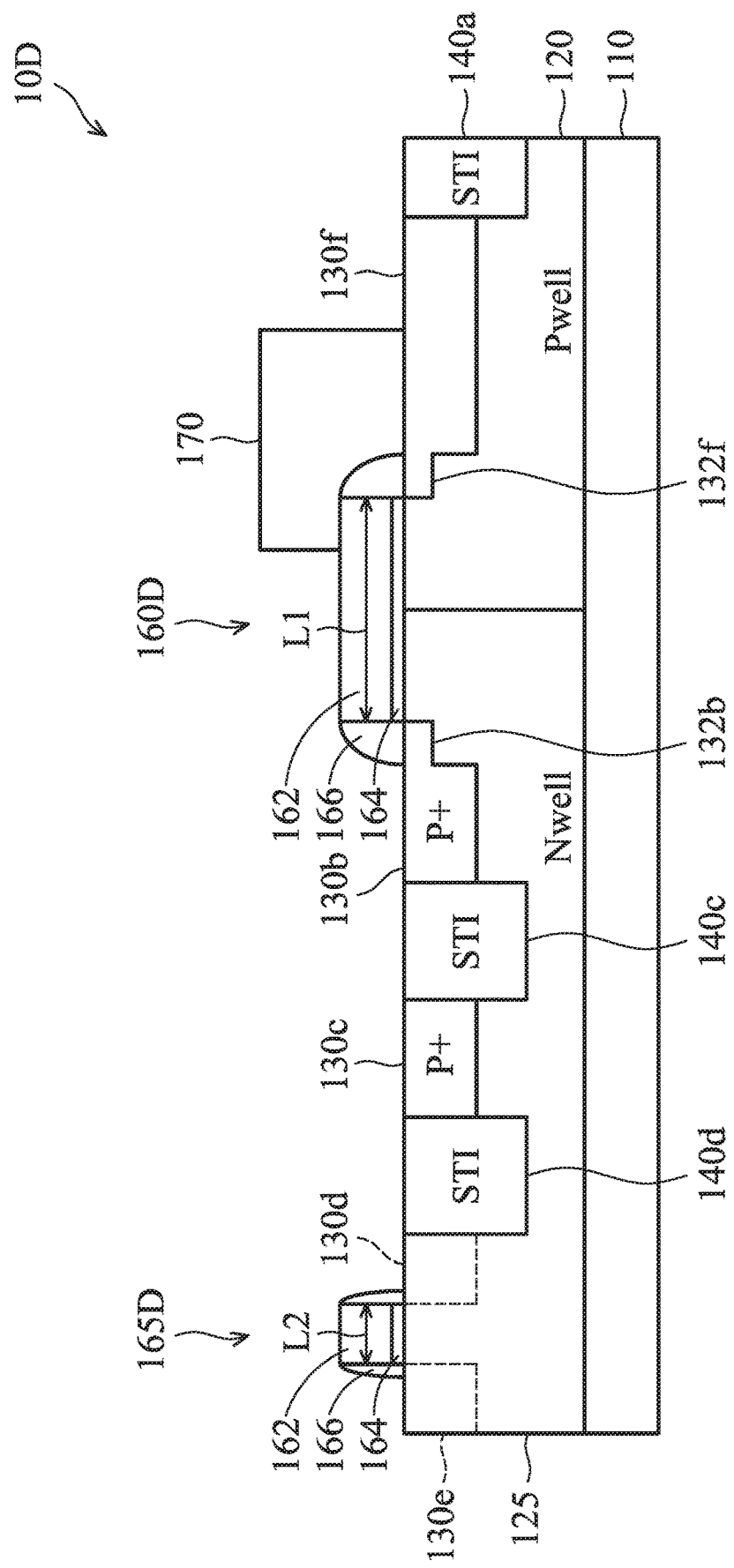
FIG. 5 shows a semiconductor device structure according to an embodiment of the invention.

FIG. 5 shows a semiconductor device structure 10D according to an embodiment of the invention. The semiconductor device structure 10D includes a P-type transistor with the gate structures 160D and 165D. In some embodiments, the P-type transistor is a P-type LDMOS transistor, the configuration of the semiconductor device structure 10D of FIG. 5 is similar to the configuration of the semiconductor device structure 10C of FIG. 4. The difference between the semiconductor device structure 10D and the semiconductor device transistor structure 10C is that no STI region 140b is formed in the semiconductor device structure 10D, and the P-type doping region 130a extends to the space of the gate structure 160D to formed a P-type doping region 130f in the P-type well region 120 of the semiconductor device structure 10D. The P-type doping region 130f is adjacent to the STI region 140a and under a portion of the RPO 170. Furthermore, the P-type doping region 130f further includes a lightly doped region 132f, and the lightly doped region 132f is formed under the right side of the gate electrode 162 of the gate structure 160D. Similarly, by changing the type of conductivity of the well regions and the doping regions in the semiconductor device structure 10D, an N-type transistor is obtained in the semiconductor device structure 10D. In some embodiments, the N-type transistor is an N-type LDMOS transistor.

Figure 6:
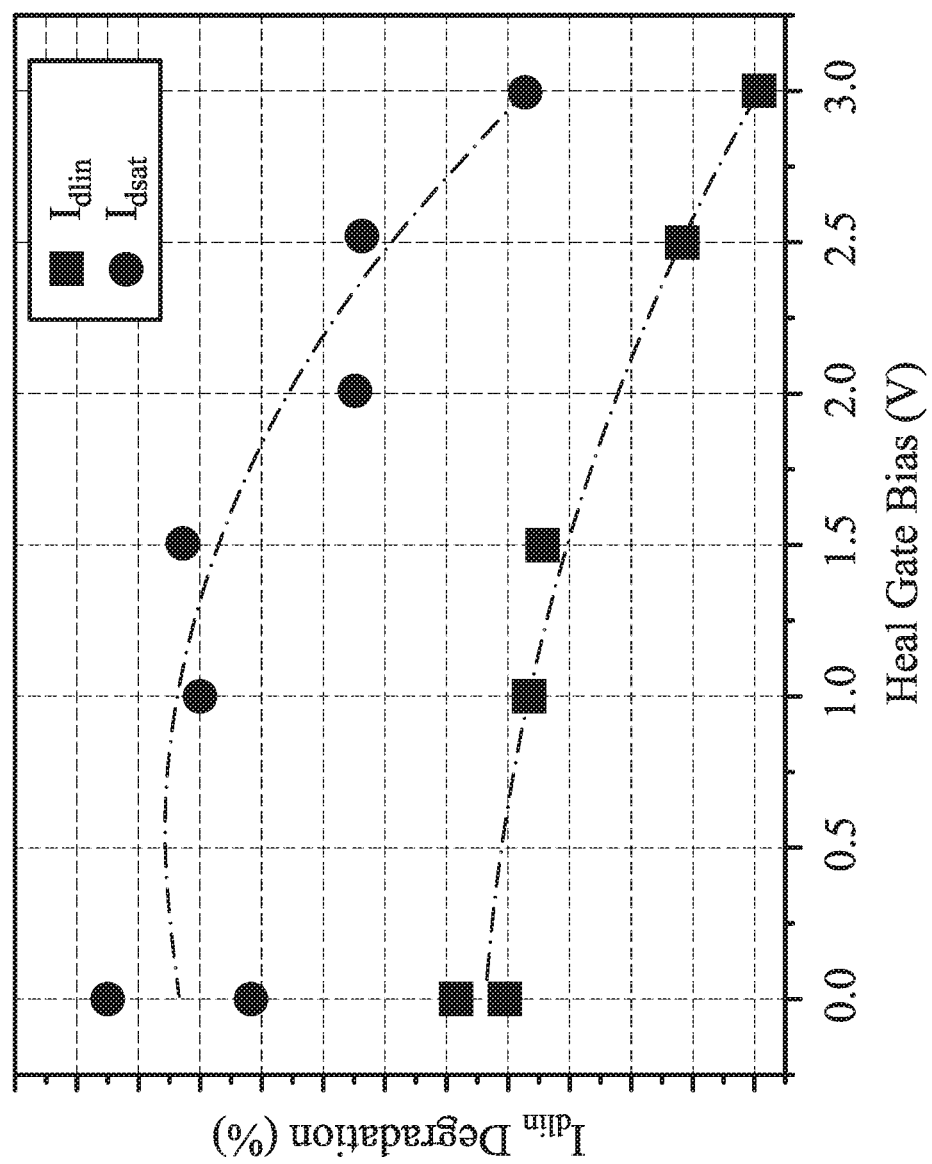
FIG. 6 shows the linear/saturation current (Idlin/Idsat) degradation after the HCI stress as a function of the healing gate voltage according to an embodiment of the invention.

The semiconductor device structures with the healing gate in the embodiments have better ability to protect against HCI degradation in high-voltage applications. FIG. 6 shows the linear/saturation current (Idlin/Idsat) degradation after the HCI stress as a function of the healing gate voltage according to an embodiment of the invention. In FIG. 6, $I_{dsat}$ and $I_{dlin}$ current degradation is efficiently suppressed once a healing bias is applied during the HCI stress. The healing effect is stronger with increasing healing gate voltage and around 35% of HCI degradation can be healed with a healing gate voltage of 3.0V. However, a healing voltage higher than a specific value (e.g., 3V) is avoid to prevent breakdown problems at the healing gate structure.

Figure 7:
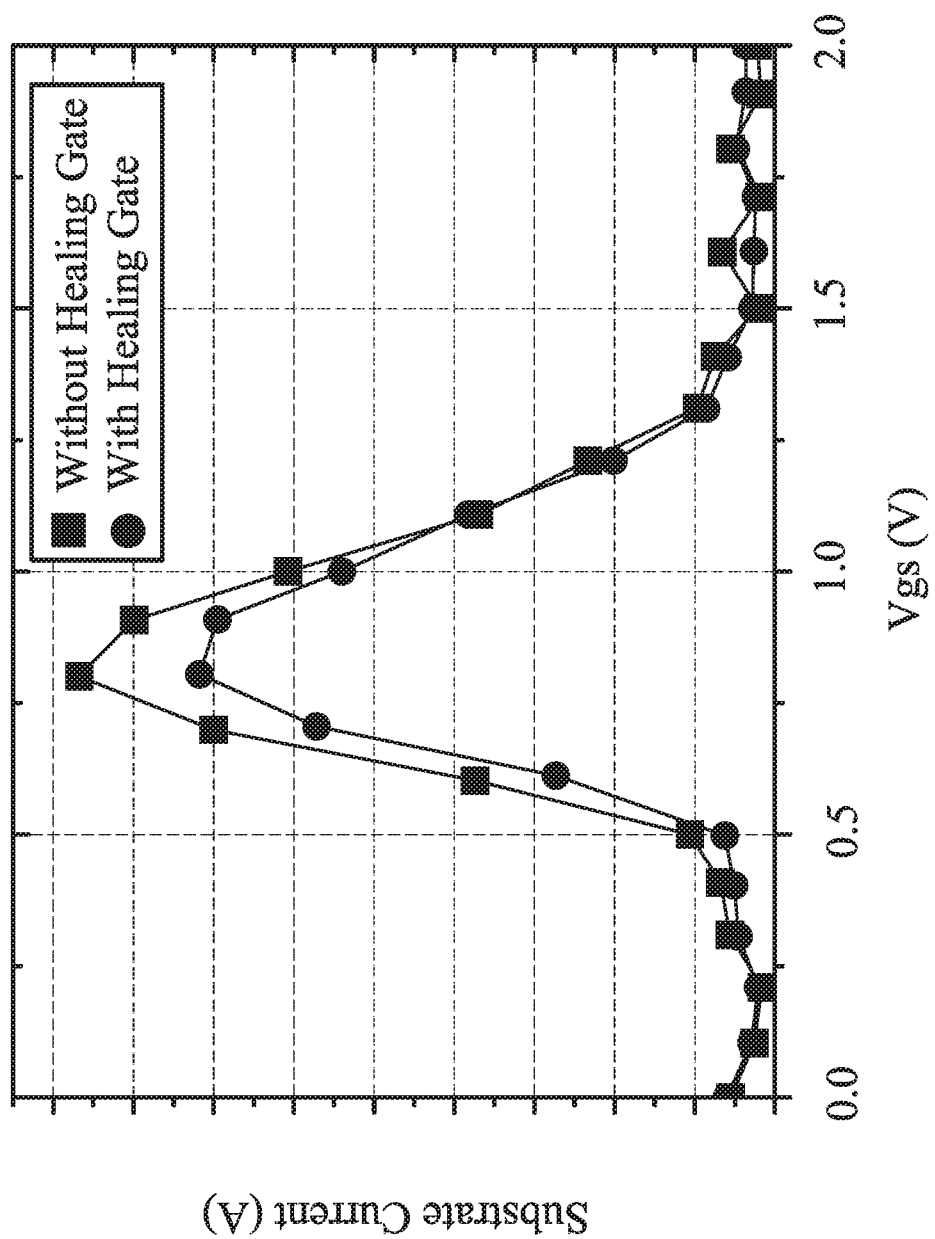
FIG. 7 shows the substrate currents with and without healing gate voltage as a function of gate voltage according to an embodiment of the invention.

The substrate current is also monitored with and without healing gate application during the HCI stress. HCI degradation is typically attributed to hot hole/electron injection which induce Si—H bond breaking. Once created, the dangling bond will become charged and consequently induce threshold voltage shift, channel current degradation, and substrate current increase. FIG. 7 shows the substrate currents with and without healing gate voltage as a function of gate voltage according to an embodiment of the invention. Under the same stress condition, the substrate current is decreased once the healing gate structure is applied. The substrate current is typically attributed to high-energy carriers in the channel causing impact ionization and therefore often correlated with HCI. With increasing healing voltage, Si—H bond breaking is suppressed as well.

Figure 8:
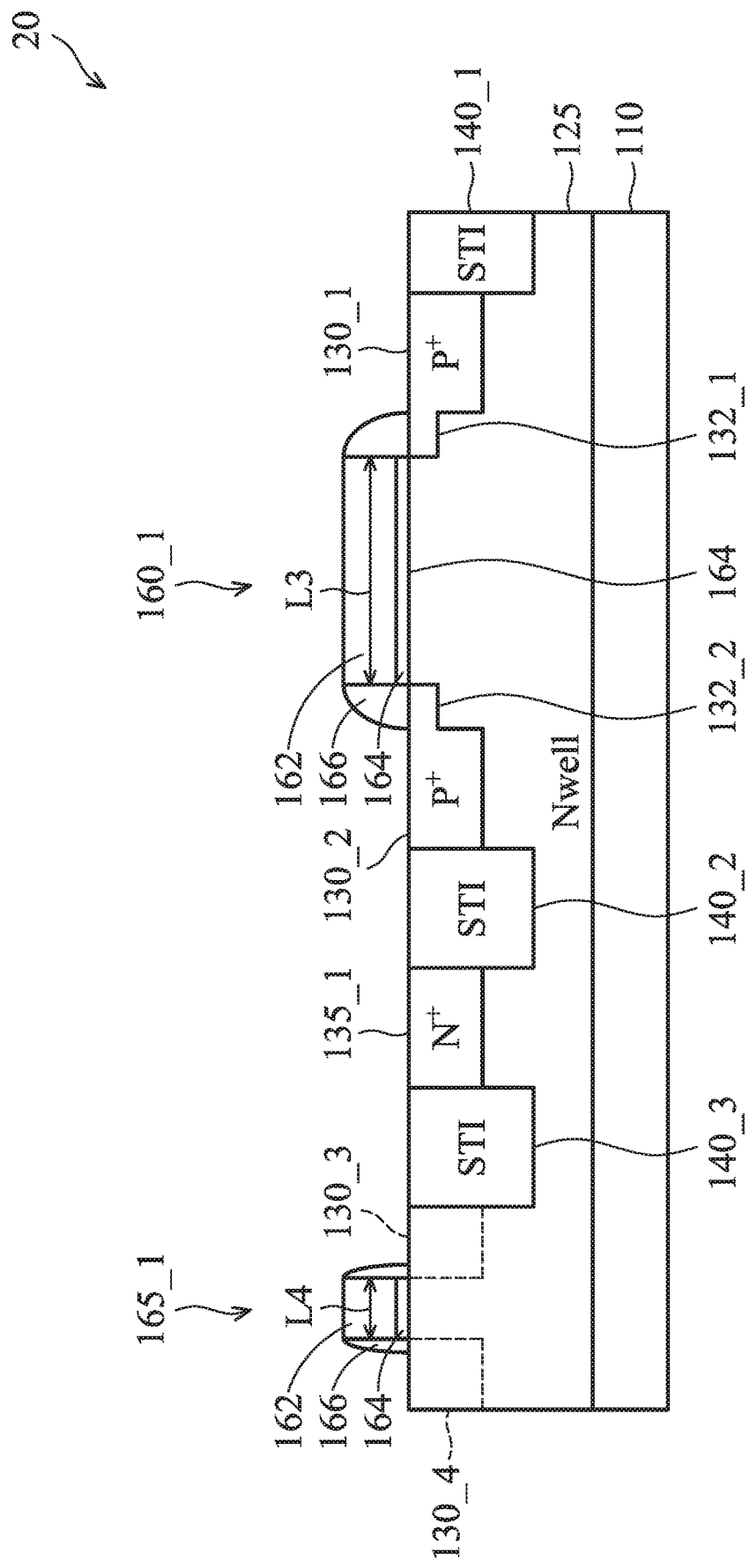
FIG. 8 shows a metal oxide semiconductor (MOS) transistor structure according to an embodiment of the invention.

FIG. 8 shows a metal oxide semiconductor (MOS) transistor structure 20 according to an embodiment of the invention. The N-type well region 125 is formed over the semiconductor substrate 110. In some embodiments, a deep N-type well (not shown) is formed over the semiconductor substrate 110, and the N-type well region 125 is formed over the deep N-type well.

The STI regions 140_1, 140_2 and 140_3 are formed in the N-type well region 125. The P-type doping regions 130_1 and 130_2 are formed in the N-type well region 125. The P-type doping region 130_1 is formed in the N-type well region 125 and adjacent to the STI region 140_1, and the P-type doping region 130_1 further includes a lightly doped region 132_1. The P-type doping region 130_2 is formed in the N-type well region 125 and adjacent to the STI region 140_2, and the P-type doping region 130_2 further includes a lightly doped region 132_2. It should be noted that the size of the P-type doping region 130_1 is equal to that of the P-type doping region 130_2.

A gate structure 160_1 is formed in the MOS transistor structure 20. The gate structure 160_1 includes a gate electrode 162, a gate dielectric 164 under the gate electrode 162, and the spaces 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the N-type well region 125. The space 166 formed on the left side of the gate electrode 162 is disposed over the lightly doped region 132_2, and the space 166 formed on the right side of the gate electrode 162 is disposed over the lightly doped region 132_1. As described above, the gate electrode 162 is configured to be coupled to interconnects.

In the MOS transistor structure 20, a P-type MOS transistor including the gate structure 160_1 is formed. The P-type doping region 130_1 forms the drain region of the P-type MOS transistor, and the P-type doping region 130_2 forms the source region of the P-type MOS transistor. The channel region of the P-type MOS transistor is formed between the P-type doping region 130_1 and the P-type doping region 130_2 and under the gate dielectric 164. Furthermore, an N-type doping region 135_1 forms the bulk region of the P-type MOS transistor.

The P-type MOS transistor further includes a gate structure 165_1. The gate structure 165_1 is an additional healing gate for the P-type MOS transistor, and the gate structure 165_1 includes a gate electrode 162, a gate dielectric 164 under the gate electrode 162, and the spaces 166 formed on opposite sides of the gate electrode 162. The spacers 166 may be formed by a single layer or multiple layers. In some embodiments, one or more work-function layers (not shown) are formed between the gate dielectric 164 and the gate electrode 162. The gate dielectric 164 is disposed on the N-type well region 125. As described above, the gate electrode 162 is configured to be coupled to interconnects. The space 166 formed on the left side of the gate electrode 162 is disposed over the P-type doping region 130_4, and the space 166 formed on the right side of the gate electrode 162 is disposed over the P-type doping region 130_3. Furthermore, no interconnect is coupled to the P-type doping regions 130_3 and 130_4. It should be noted that no channel region is formed under the gate structure 165_1. In some embodiments, only the gate structure 165_1 is formed in the MOS transistor structure 20 without the P-type doping regions 130_3 and 130_4. In some embodiments, the gate length L3 of the gate structure 160_1 is greater than the gate length L4 of the gate structure 165_1. In some embodiments, the gate length L3 of the gate structure 160_1 is equal to the gate length L4 of the gate structure 165_1. Similarly, by changing the type of conductivity of the well regions and the doping regions in the MOS transistor structure 20, an N-type MOS transistor is obtained in the MOS transistor structure 20.

According to the embodiments, the self-healing MOSFETs are provided. By adding the healing gate structure, hot-carrier instability (HCI) degradation can be efficiently suppressed without the drawback of increasing leakage. Substrate current and time dependence of the HCI degradation (N-factor) are improved in the healing mechanism. With healing gate bias, the HCI stress injected hot carriers can be recovered and consequently the current degradation suppressed. In some embodiments, 30% reduction of HCI degradation can be achieved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A semiconductor device structure, comprising:
a semiconductor substrate;
a first well region over the semiconductor substrate and having a first type of conductivity;
a second well region over the semiconductor substrate and having a second type of conductivity that is different from the first type of conductivity;
a well region over the semiconductor substrate and between the first and second well regions, wherein the well region has a third type of conductivity that is different from the first type of conductivity and the second type of conductivity;
a first gate structure of a transistor disposed on the well region and partially over the first and second well regions;
a drain region of the transistor in the first well region and having the first type of conductivity;
a source region of the transistor in the second well region and having the first type of conductivity;
a bulk region of the transistor in the second well region and having the first type of conductivity; and
a second gate structure of the transistor disposed on the second well region,
wherein the second gate structure is separated from the first gate structure by the source region and the bulk region.

2. The semiconductor device structure as claimed in claim 1, wherein a gate length of the first gate structure is greater than that of the second gate structure.

3. The semiconductor device structure as claimed in claim 1, further comprising:
- a first shallow trench isolation (STI) region in the second well region, wherein the second gate structure is separated from the bulk region by the first STI region; and
- a second STI region in the second well region and between the source region and the bulk region.

4. The semiconductor device structure as claimed in claim 1, further comprising:
- a third STI region in the first well region, wherein the first gate structure is separated from the drain region by the third STI region.

5. The semiconductor device structure as claimed in claim 1, further comprising:
- a resist protect oxide (RPO) formed over a portion of the first gate structure and a portion of the drain region.

6. The semiconductor device structure as claimed in claim 1, wherein the first type of conductivity is N-type, and the second type of conductivity is P-type, and the transistor is an N-type laterally diffused metal oxide semiconductor (LDMOS) transistor.

7. The semiconductor device structure as claimed in claim 1, wherein the first type of conductivity is P-type, and the second type of conductivity is N-type, and the transistor is a P-type LDMOS transistor.

8. A semiconductor device structure, comprising:
- a semiconductor substrate;
- a first well region over the semiconductor substrate and having a first type of conductivity;
- a second well region over the semiconductor substrate and having a second type of conductivity that is different from the first type of conductivity;
- a first gate structure disposed partially over the first and second well regions;
- a drain region of the first type of conductivity in the first well region;
- a source region of the first type of conductivity in the second well region;
- a bulk region in the second well region; and
- a second gate structure disposed on the second well region,
- wherein the second gate structure is separated from the first gate structure by the source region and the bulk region,
- wherein gate length of the first gate structure is greater than that of the second gate structure,
- wherein the bulk region has the first type of conductivity.

9. The semiconductor device structure as claimed in claim 8, further comprising:
- a first shallow trench isolation (STI) region in the second well region, wherein the second gate structure is separated from the bulk region by the first STI region; and
- a second STI region in the second well region and between the source region and the bulk region.

10. The semiconductor device structure as claimed in claim 8, further comprising:
- a STI region in the first well region, wherein the first gate structure is separated from the drain region by the STI region.

11. The semiconductor device structure as claimed in claim 10, further comprising:
- a resist protect oxide (RPO) formed directly over a portion of the first gate structure, a portion of the drain region, and a portion of STI region.

12. The semiconductor device structure as claimed in claim 8, further comprising:
- a resist protect oxide (RPO) formed directly over a portion of the first gate structure, and a portion of the drain region.

13. The semiconductor device structure as claimed in claim 8, further comprising:
- a doping region in the second well region and having the first type of conductivity, wherein the second gate structure is separated from the bulk region by the doping region.

14. A semiconductor device structure, comprising:
- a semiconductor substrate;
- a first well region over the semiconductor substrate and having a first type of conductivity;
- a second well region over the semiconductor substrate and having a second type of conductivity that is different from the first type of conductivity;
- a first gate structure disposed partially over the first and second well regions;
- a drain region of the first type of conductivity in the first well region;
- a source region of the first type of conductivity in the second well region;
- a bulk region of the first type of conductivity in the second well region;
- a lightly doped region of the first type of conductivity in the second well region and under the first gate structure; and
- a second gate structure disposed on the second well region,
- wherein the second gate structure is separated from the first gate structure by the source region,
- wherein the lightly doped region is in direct contact with the source region.

15. The semiconductor device structure as claimed in claim 14, wherein gate length of the first gate structure is greater than that of the second gate structure.

16. The semiconductor device structure as claimed in claim 14, further comprising:
- a first shallow trench isolation (STI) region in the second well region, wherein the second gate structure is separated from the bulk region by the first STI region; and
- a second STI region in the second well region and between the source region and the bulk region.

17. The semiconductor device structure as claimed in claim 14, further comprising:
- a STI region in the first well region, wherein the first gate structure is separated from the drain region by the STI region.

18. The semiconductor device structure as claimed in claim 14, further comprising:
- a well region over the semiconductor substrate and between the first and second well regions,
- wherein the well region has a third type of conductivity that is different from the first type of conductivity and the second type of conductivity.

* * * * *